United States Patent
Lin et al.

(10) Patent No.: US 11,935,817 B2
(45) Date of Patent: Mar. 19, 2024

(54) POWER DEVICE MODULE WITH DUMMY PAD DIE LAYOUT

(71) Applicant: SEMICONDUCTOR COMPONENTS INDUSTRIES, LLC, Phoenix, AZ (US)

(72) Inventors: Yusheng Lin, Phoenix, AZ (US); Jerome Teysseyre, Scottsdale, AZ (US); Huibin Chen, SIP Suzhou (CN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 289 days.

(21) Appl. No.: 16/949,130

(22) Filed: Oct. 15, 2020

(65) Prior Publication Data
US 2021/0118774 A1 Apr. 22, 2021

Related U.S. Application Data

(60) Provisional application No. 62/924,104, filed on Oct. 21, 2019.

(51) Int. Cl.
*H01L 23/492* (2006.01)
*H01L 21/48* (2006.01)
*H01L 23/00* (2006.01)
*H01L 23/14* (2006.01)
*H01L 23/498* (2006.01)
(Continued)

(52) U.S. Cl.
CPC ........ *H01L 23/492* (2013.01); *H01L 21/4853* (2013.01); *H01L 21/4875* (2013.01); *H01L 23/14* (2013.01); *H01L 23/49811* (2013.01); *H01L 23/50* (2013.01); *H01L 24/06* (2013.01); *H01L 24/14* (2013.01); *H01L 23/3735* (2013.01); *H01L 23/5383* (2013.01); *H01L 25/18* (2013.01)

(58) Field of Classification Search
CPC .............. H01L 23/492; H01L 21/4853; H01L 21/4875; H01L 23/14; H01L 23/49811; H01L 25/18; H01L 2224/06517; H01L 2924/3511; H01L 2924/35121; H01L 23/50; H01L 23/49844; H01L 24/06; H01L 23/3735; H01L 23/5383; H01L 25/072
See application file for complete search history.

(56) References Cited

U.S. PATENT DOCUMENTS

| | | | | |
|---|---|---|---|---|
| 2011/0244636 A1* | 10/2011 | Kondo | ............ | H01L 24/81 257/E21.502 |
| 2011/0266666 A1* | 11/2011 | Maeda | ............ | H01L 24/19 438/126 |
| 2015/0216054 A1* | 7/2015 | Standing | ............ | H01L 25/072 228/180.21 |

* cited by examiner

*Primary Examiner* — Ahmed N Sefer
(74) *Attorney, Agent, or Firm* — Brake Hughes Bellermann LLP

(57) ABSTRACT

A method includes disposing a plurality of active solder pads and at least one mechanical support solder pad on the substrate. The plurality of active solder pads provide areas for mechanical bonding of the substrate to at least one device contact pad disposed on a semiconductor die. The at least one mechanical support solder pad provides an area for mechanical bonding of the substrate to at least one dummy device contact pad disposed on the semiconductor die. The method further includes mechanically bonding the substrate to the semiconductor die by forming solder joints between the plurality of active solder pads and the at least one device contact pad, and between the at least one mechanical support pad and the at least one dummy device contact pad.

20 Claims, 9 Drawing Sheets

(51) Int. Cl.
*H01L 23/50* (2006.01)
*H01L 23/373* (2006.01)
*H01L 23/538* (2006.01)
*H01L 25/18* (2023.01)

Disposing a plurality of active solder pads on a substrate, the plurality of active solder pads providing areas for mechanical bonding of the substrate to one or more device contact pads disposed on a semiconductor die
910

Disposing one or more mechanical support solder pads on the substrate, the one or more mechanical support solder pads providing areas for mechanical bonding of the substrate to one or more dummy device contact pads disposed on the semiconductor die
920

Mechanically bonding the substrate to the semiconductor die by forming solder joints between the plurality or active solder pads and the one or more device contact pads, and between the one or more mechanical support pads and the one or more dummy device contact pads
930

POWER DEVICE MODULE WITH DUMMY PAD DIE LAYOUT

RELATED APPLICATION

This application claims the benefit of, and priority to, U.S. Provisional Application No. 62/924,104, filed Oct. 21, 2019, which is hereby incorporated by reference in its entirety herein.

TECHNICAL FIELD

This description relates to semiconductor die in high power device module packages.

BACKGROUND

Power devices (e.g., insulated gate bipolar transistors (IGBTs)) are used as switching devices in many electric power conversion systems. The power devices are incorporated in power modules for different industrial and automotive applications.

In the power modules (e.g., dual side cooled Automotive High-Power Modules (AHPM)), semiconductor device dies can be attached to an electrical circuit board (e.g., a direct bonded copper (DBC) substrate). The DBC substrate can have a printed circuit board structure with a conductive metal (e.g., copper, aluminum) pattern for carrying current and voltage signals.

SUMMARY

An electronic device is formed in a semiconductor die. A plurality of device contact pads and a dummy device contact pad are disposed on a surface of the semiconductor die. The plurality of device contact pads are electrically connected to the electronic device. The plurality of device contact pads include at least an emitter contact pad and a signal sense contact pad. The dummy device contact pad provides an area for a solder joint between the semiconductor die and a substrate in addition to an area provided by the plurality of device contact pads.

In example implementations, the dummy device contact pad is disposed on the surface at a position closer to a corner of the semiconductor die than to a sagittal axis of the semiconductor device.

In example implementations, the plurality of device contact pads are disposed bisymmetrically about a sagittal axis on the surface of the semiconductor die, the signal sense contact pad is included in a plurality of signal sense contact pads disposed in a row on the surface along an edge of the semiconductor die, and the dummy device contact pad is disposed on an longitudinal end of the row of the plurality of signal sense contact pads disposed the surface along the edge of the semiconductor die.

In example implementations, the dummy device contact pad is electrically isolated from the electronic device formed in the semiconductor die. In some example implementations, the dummy device contact pad is electrically connected to the electronic device via one of the device contact pads.

A package includes a semiconductor die bonded to a substrate. A layout of solder pads is disposed on a conductive trace on the substrate, the solder pads providing areas for mechanically bonding the substrate to the semiconductor die. The layout of solder pads includes a plurality of active solder pads providing electrical connections to an electronic device formed in the semiconductor die, and a mechanical support solder pad that provides an area in addition to an area provided by the plurality of active solder pads for mechanical bonding of the substrate to the semiconductor die.

In example implementations, the mechanical support solder pad mechanically bonds a corner portion of the substrate to the semiconductor die.

In example implementations, the plurality of active solder pads includes at least an emitter contact solder pad and at least one active signal sense contact solder pad. The at least one active signal sense contact solder pad is electrically connected to a corresponding one of a plurality of signal sense contact pads disposed in a row on the semiconductor die.

In example implementations, the mechanical support solder pads is disposed about an longitudinal end of the row of the plurality of signal sense contact pads disposed on the semiconductor die.

In example implementations, the mechanical support solder pad is electrically isolated from the electronic device formed in the semiconductor die.

In some example implementations, the mechanical support solder pad is electrically connected to the electronic device formed in the semiconductor die via a device contact pad disposed on the semiconductor die.

The details of one or more implementations are set forth in the accompanying drawings and the description below. Other features will be apparent from the description and drawings, and from the claims.

BRIEF DESCRIPTION OF THE DRAWINGS

FIG. 9 illustrates an example method for making a device package.

DETAILED DESCRIPTION

Figure 1:
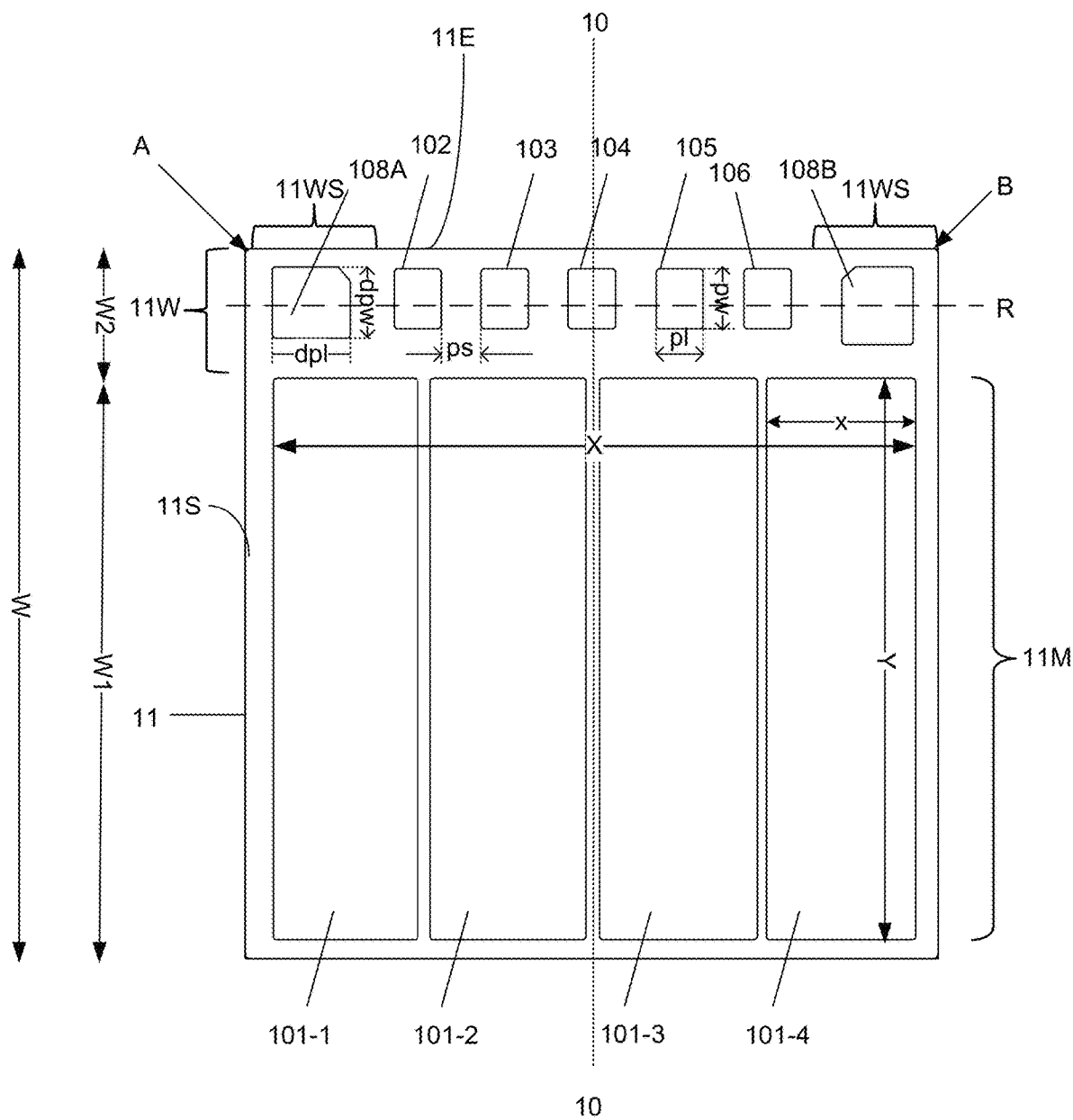
FIGS. 1 through 3 illustrate example layouts of device contact pads on top surfaces of semiconductor die.

Modern high power electronic devices (e.g., insulated gate bipolar transistors (IGBTs), fast recovery diodes (FRD), etc.) and circuits are fabricated in semiconductor die that have increasingly large areas and decreasing thicknesses. Conductive metal or metalized device contacts (hereinafter "device contact pads") disposed on a surface of the semiconductor die may provide external electrical contacts (e.g., device terminals) to an electronic device and circuit elements within the semiconductor die. Each device contact pad may provide an electrical connection for a respective specific input/output (I/O) function of the semiconductor die. In example implementations, a semiconductor die (including, e.g., an IGBT device) may have one or more device contact pads as external electrical contacts (e.g., emitter contact pads) to an emitter of the device, and several other device contact pads (e.g., signal sense contact pads) as external electrical contacts to other terminals (e.g., gate, emitter sense, collector sense, current sense, temperature sense cathode, temperature sense anode, etc.) of the device. For power devices, in which the emitter can carry high currents, the emitter contact pads may have areas that are substantially larger than the areas of the other pads (signal sense contact pads), for example, in proportion to the currents that may be expected to flow through the pads.

The semiconductor die can be packaged for use in a power module. The power module package can be a package for connecting the semiconductor die to the external environment via leads such as lands, balls, or pins. The package may provide protection against threats such as mechanical impact, chemical contamination, and light exposure. Additionally, the package may help dissipate heat produced by the semiconductor die.

In a typical power module, the semiconductor die may be mechanically attached or bonded to a direct bonded copper (DBC) substrate to form a semiconductor die-DBC substrate combination. Device contact pads on the semiconductor die can be coupled (e.g., bonded) to a corresponding conductive metal trace pattern (e.g., printed circuit traces) on DBC substrate using, for example, solder joints (e.g., solder balls, solder pads, etc.). The solder joints provide continuity of electrical and thermal flow paths from device contacts (e.g., device terminals) on the semiconductor die through the conductive metal trace pattern of the DBC substrate. Each solder joint may, for example, provide an electrical connection for a respective specific I/O function of the semiconductor die. Mechanical and structural integrity of the solder joints is essential for proper electrical functioning of the power modules.

Like the semiconductor die for the modern high power devices (e.g., insulated gate bipolar transistors (IGBTs), fast recovery diodes (FRD), etc.), modern power module packages have increasingly large areas and decreasing thicknesses. The modern power high power devices can have silicon die sizes substantially greater than the silicon die sizes of previous high power devices (e.g., <100 square millimeters). The modern power high power devices may have silicon die sizes that are greater than 100 square millimeters or even greater than 225 square millimeters. Further, the modern power high power devices along with the greater silicon die size can have thinner and thinner silicon thicknesses (e.g., a thickness of 70 micrometers or less). As a result, the modern power module packages have increasingly large areas and decreasing thicknesses. To meet a target thermal performance, thermal-mechanical stress balance across all dimensions of silicon die and package have to considered. The innovations described herein address these newly discovered and unresolved issues due to size and thinness.

Differences in the thermal expansion co-efficient (TEC) of the different components of a power module (e.g., DBC substrate, semiconductor die, solder joints, electronic mold compounds (EMC), etc.) can result in, for example, thermally-induced flexing, bending or warpage (warpage) of the components of the semiconductor die-DBC substrate combination. This thermally-induced warpage can have a deleterious effect, for example, on the mechanical and structural integrity of the solder joints between the semiconductor die and the DBC substrate, degrade the electrical and thermal flow paths from the device contacts, and consequently affect the electrical functioning and reliability of the power module. The effects of the thermally-induced warpage may be more pronounced moving from a center toward an edge of the semiconductor die-DBC substrate combination in the power module package, and may be more pronounced for solder joints to small-area device contacts (e.g., signal sense contact pads) than for solder joints to large-area device contacts (e.g., emitter contact pads).

A semiconductor die has a geometrical layout of device contact pads that provide areas or locations for bonding (e.g., using solder joints) the semiconductor die to a substrate. The geometrical layout of device contact pads is configured to reduce or mitigate, for example, the effects of thermally-induced warpage of power module package components on the solder joints, in accordance with the principles of the present disclosure.

In an example geometrical layout, the device contact pads disposed on a surface of a semiconductor die may include one or more dummy device contact pads (mechanical support pads) that have a mechanical function of providing more mechanical contact area for solder joints between the semiconductor die and a DBC substrate (e.g., more mechanical contact area than provided by signal sense contact pads disposed on the semiconductor die). In some example implementations, a dummy device contact pad may have only a mechanical function and no electrical function (i.e., they may not provide an electrical connection to any I/O function of the semiconductor die.) In some example implementations, a dummy device contact pad, in addition to providing more contact area for solder joints, may have an electrical function (i.e., they may provide an electrical connection to a specific I/O function of the semiconductor die), for example, in combination with, or via, another device contact pad (e.g., an emitter contact pad) on the semiconductor die.

Figure 2:
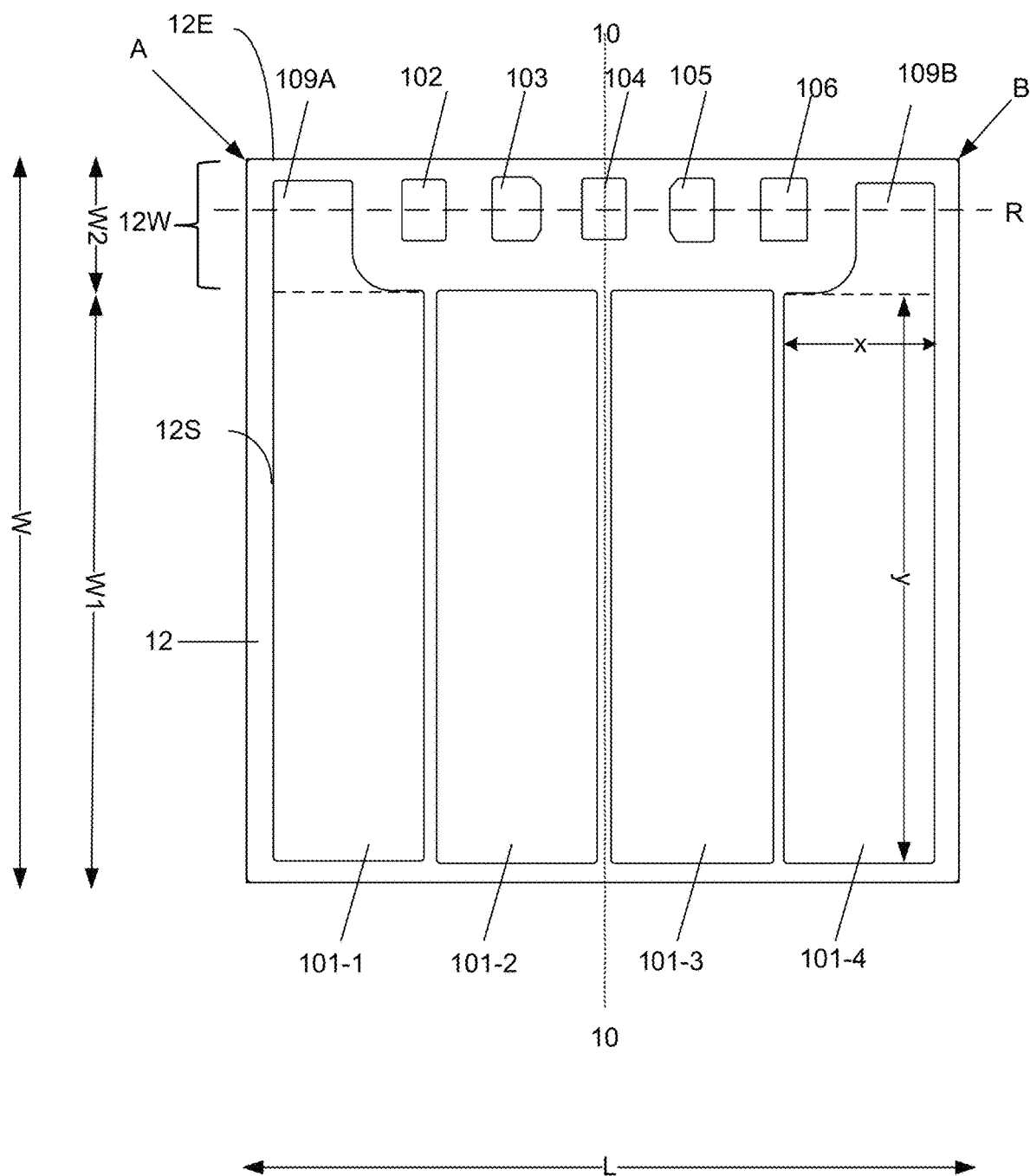
Figure 3:
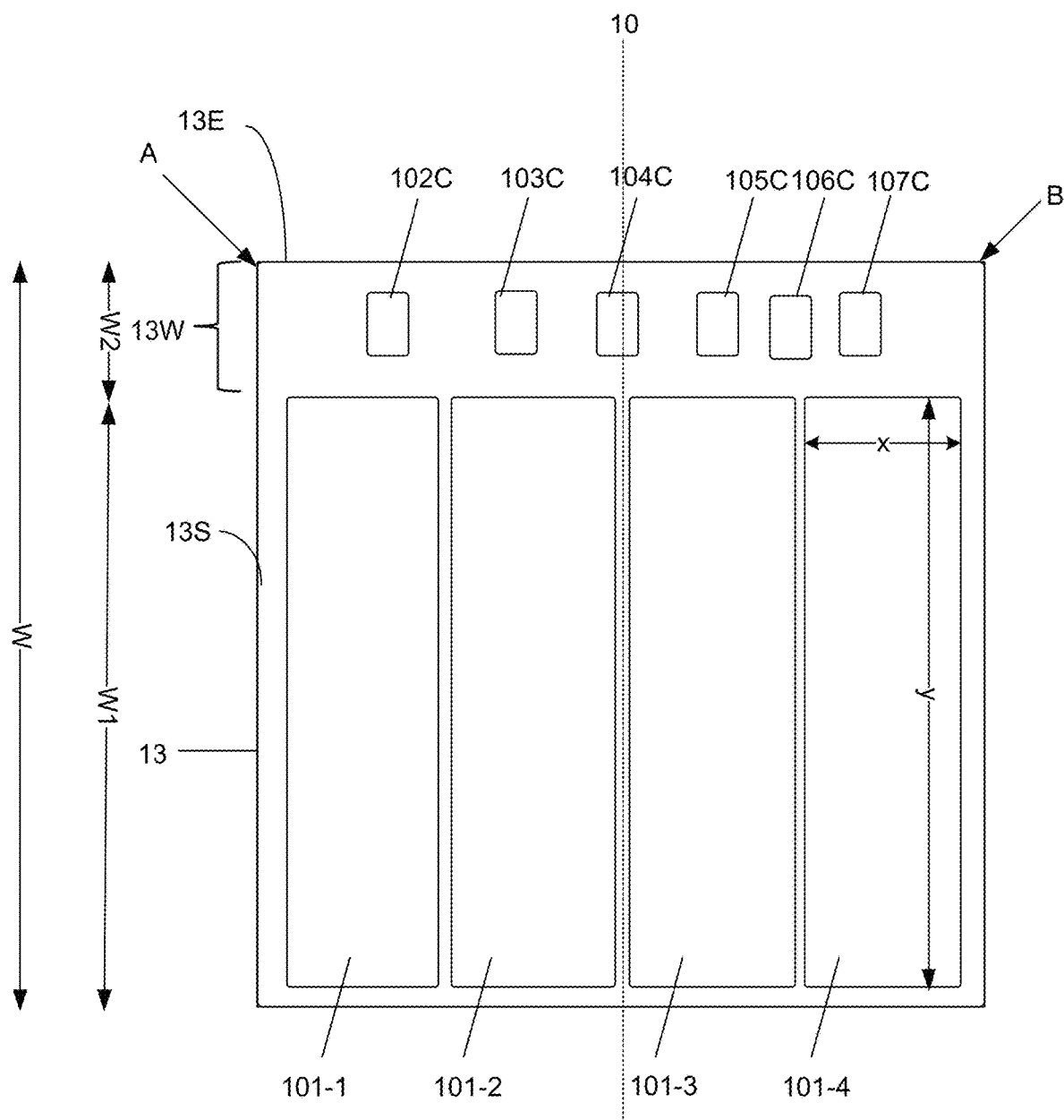

FIGS. 1 through 3 show example layouts of device contact pads on top surfaces of semiconductor die, in accordance with the principles of the present disclosure.

FIG. 1 shows a semiconductor die 11 with an example layout 100A of device contact pads including one or more dummy device contact pads disposed on a top surface 11S of the semiconductor die. In example implementations, semiconductor die 11 may, for example, include an IGBT device and circuit (FIG. 9). Semiconductor die 11 may have a generally square or rectangular shape with a length L and a width W. The dimensions of each side of the semiconductor may be in a range of several millimeters. For example, W may be in a range of 10 to 20 millimeters, and L may also be in a range of 10 to 20 millimeters.

Layout 100A includes an arrangement of emitter contact pads (e.g., pads 101-1, 101-2, 101-3, 101-4), and one or more other signal sense contact pads (e.g., collector sense (CS) pad 102, emitter sense (ES) pad 103, gate (G) pad 104, temperature sense (TS) pad 105, temperature anode (TA) pad 106, etc.).

The emitter contact pads (e.g., pads 101-1, 101-2, 101-3, 101-4) may be disposed in an emitter region 11M of top surface 11S. Emitter region 11M may have an area ~W1*L. Emitter region 11M (in which emitter contact pads 101-1, 101-2, 101-3, and 101-4 are disposed) may occupy a substantial portion of a total area (e.g., ~W*L) of top surface 11S. The emitter contact pads may occupy an area (e.g., ~X*Y) in emitter region 11M with each emitter pad (e.g., pads 101-1, 101-2, 101-3, 101-4) having a length ~x and a width ~Y). In example implementations, emitter region 11M may have an area of about X=11.90 millimeters by Y=14.0 millimeters.

In layout 100A, an arrangement of the one or more other signal sense contact pads (e.g., CS pad 102, ES pad 103, gate pad 104, TS pad 105, TA pad 106, etc.) may be disposed in a strip 11W of top surface 11S alongside an edge 11E (e.g., between a first corner A and a second corner B) of the semiconductor die. Strip 11W may have a width W2 perpendicular to edge 11E and a length L along edge 11E. In example implementations, strip 11W may have width W2 in a range of a few millimeters (e.g., 1 millimeter to 5 millimeters).

In an example implementation, the one or more other signal sense contact pads (e.g., CS pad 102, ES pad 103, gate pad 104, TS pad 105, TA pad 106, etc.) may be arranged, for example, in a row R on surface 11S in strip 11W alongside edge 11E of the semiconductor die 11.

In example implementations, each of the one or more other signal sense contact pads may have similar shapes (e.g., a circular, oval or rectangular shape). In FIG. 1, the one or more other signal sense contact pads are shown, for example, as having a generally rectangular shape with a pad width pw and a pad length p1. In example implementations, the one or more other signal sense contact pads may, for example, be evenly spaced (e.g. with an inter-pad spacing ~ps). In example implementations, the signal sense contact pads may be a few millimeters in size (e.g., pw=1.3 millimeters and p1=1.0 millimeter. The inter-pad spacing ps may also be about a few millimeters in size (e.g., ps=1.0 millimeter).

In example implementations, the arrangement of the one or more other signal sense contact pads (e.g., CS pad 102, ES pad 103, gate pad 104, TS pad 105, TA pad 106, etc.) in strip 11W on surface 11S may be bisymmetric about a sagittal (bilateral axis 10) of the semiconductor die.

Layout 100A further includes one or more dummy device contact pads (mechanical support pads) (e.g., pad 108A and pad 108B) that provide additional mechanical contact area for solder joints between the semiconductor die and a DBC substrate in addition to the mechanical contact area provided by the one or more other signal sense contact pads (e.g., CS pad 102, ES pad 103, gate pad 104, TS pad 105, TA pad 106, etc.).

In example implementations, pad 108A and pad 108B may be disposed in strip 11W (having a width W2 and a length L) alongside edge 11E. Pad 108A may be disposed on one longitudinal side portion 11WS of strip 11W (e.g., at one longitudinal end of the row R of signal sense contact pads), and pad 108B may be disposed on a second longitudinal side portion 11WS of strip 11W (at the other longitudinal end of the row R of signal sense contact pads). Pad 108A and pad 108B as disposed in the longitudinal side portions 11WS of strip 11W may be in positions closer to corners A and B of semiconductor die 11, respectively, than to the sagittal axis (e.g., bilateral axis 10) of semiconductor die 11. Pad 108A and pad 108B may be disposed at the respective positions closer to corners A and B without a signal sense contact pad (or other pad) being closer to the respective corners A and B. Pad 108A and/or pad 108B may be disposed at the respective positions relatively close to corners A and B without a signal sense contact pad (or other pad) being disposed between the pad 108A and/or pad 108B and their respective corners.

In example implementations, each of the dummy device contact pads (mechanical support pads) (e.g., pad 108A and pad 108B) may have similar shapes (e.g., a circular, oval or rectangular shape). In FIG. 1, the dummy device contact pads (e.g., pad 108A and pad 108B) are shown, for example, as having a generally rectangular shape with a pad width ~dpw and a pad length ~dpl. Like the other signal sense contact pads, pads 108A and 108B may also be disposed bisymmetrically about bilateral axis 10. In example implementations, the device dummy contact pads may be a few millimeters in size (e.g., dpw=1.3 millimeters and dpl=1.0 millimeters.

In layout 100A, dummy device contact pads 108A and 108B may be electrically isolated from the device and circuit in semiconductor die 11 and from other device contact pads (emitter contact pads and other signal sense contact pads). Dummy device contact pads 108A and 108B may have only a mechanical function for making solder joints between the semiconductor die and a DBC substrate.

FIG. 2 shows a semiconductor die 12 with a layout 100B of device contact pads including dummy device contact pads disposed on a top surface 12S of the semiconductor die. In example implementations, semiconductor die 12, like semiconductor die 11, may, for example, include an IGBT device and circuit. Semiconductor die 12 may have a generally rectangular shape with top surface 12S having a length L and a width W.

Layout 100B, like layout 100A (FIG. 1), includes a bisymmetric arrangement of pads 101-1, 101-2, 101-3, 100-4 (e.g., emitter contact pads), and signal sense contact pads (e.g., CS pad 102, ES pad 103, gate pad 104, TS pad 105, TA pad 106, etc.) disposed on surface 12S of the semiconductor die. The signal sense contact pads (e.g., CS pad 102, ES pad 103, gate pad 104, TS pad 105, TA pad 106, etc.) may be disposed, for example, in a row R in a strip 12W of surface 12S alongside edge 12E (e.g., between a corner A and a corner B) of the semiconductor die.

Layout 100B further includes dummy device contact pads (mechanical support pads) (e.g., pads 109A and 109B) that are disposed in corner portions near, or proximate to, corners A and B of the semiconductor die Like pads 108A and 108B on semiconductor die 11 (FIG. 1), the dummy device contact pads (mechanical support pads) (e.g., pads 109A and 109B) on semiconductor die 12 can provide additional mechanical contact area for solder joints between the semiconductor die and a DBC substrate in addition to the mechanical contact area provided by the one or more other signal sense contact pads (e.g., CS pad 102, ES pad 103, gate pad 104, TS pad 105, TA pad 106, etc.). Unlike pads 108A and 108B of layout 100A (FIG. 1), pads 109A and 109B on semiconductor die 12 extend into, merge with, or are connected to, the emitter contact pads (e.g., pads 101-1 and 101-4, respectively). Thus, dummy device contact pads 108A and 108B are not electrically isolated from the device and circuit in semiconductor die 12. Dummy device contact pads 109A and 109B, in addition to their mechanical support function for solder joints, may have an active signal carrying function via their connection to the emitter contact pads (e.g., pads 101-1 and 101-4, respectively).

FIG. 3 shows a semiconductor die 13 having a traditional layout 100C of device contact pads on a top surface 13S of the semiconductor die. Unlike layout 100A (FIG. 1) and layout 100B (FIG. 2), traditional layout 100C may not include any dummy device contact pads. In example implementations, semiconductor die 13, like semiconductor die 11 (FIG. 1) and semiconductor die 12 (FIG. 2), may, for example, include an IGBT device and circuit. Semiconductor die 13 may have a generally rectangular shape with top surface 13S having a length L and a width W.

Traditional layout 100C includes emitter contact pads (e.g., pads 101-1. 101-2, 101-3, and 101-4) and signal sense contact pads (e.g., pad 102C, pad 103C, gate pad 104C, pad 105C, pad 106C, pad 107C, etc.). The signal sense contact pads may be disposed in a row R on surface 13S of the semiconductor die in a strip 13W alongside an edge 13E (e.g., between a corner A and a corner B) of the semiconductor die.

The signal sense contact pads (e.g., e.g., pad 102C, pad 103C, gate pad 104C, pad 105C, pad 106C, pad 107C, etc.) in layout 100C may be asymmetrically disposed about the sagittal (bilateral axis 10) of the semiconductor die (unlike the bisymmetrically disposed signal sense contact pads in layout 100A and layout 100B). Furthermore, layout 100C, unlike layout 100A and layout 100B, does not include dummy device contact pads (mechanical support pads) (i.e., does not include dummy device contact pads such as pads 108A, 108B, 109A, or 109B).

In an example dual-side cooled power device package for switching applications, a semiconductor die can be attached to an electrical circuit board (e.g., a direct bonded copper (DBC) substrate) in a flip-chip configuration using solder as a joining material to form a semiconductor die-substrate combination in the package. An underlying DBC substrate may provide one side of the dual side cooling of the semiconductor die in the package. Metal or metalized conductive pads (e.g., device contact pads) disposed on the surface of the semiconductor die may provide external contacts (e.g., device terminals) to device and circuit elements in the semiconductor die.

Further, a conductive block (e.g., a spacer block) (e.g., a copper or copper alloy) may be coupled to a top surface of the semiconductor die. A second DBC substrate may be placed over the spacer block. The spacer block may provide a thermal pathway to the second DBC substrate for the second side of the dual side cooling of the semiconductor die in the package.

Figure 4:
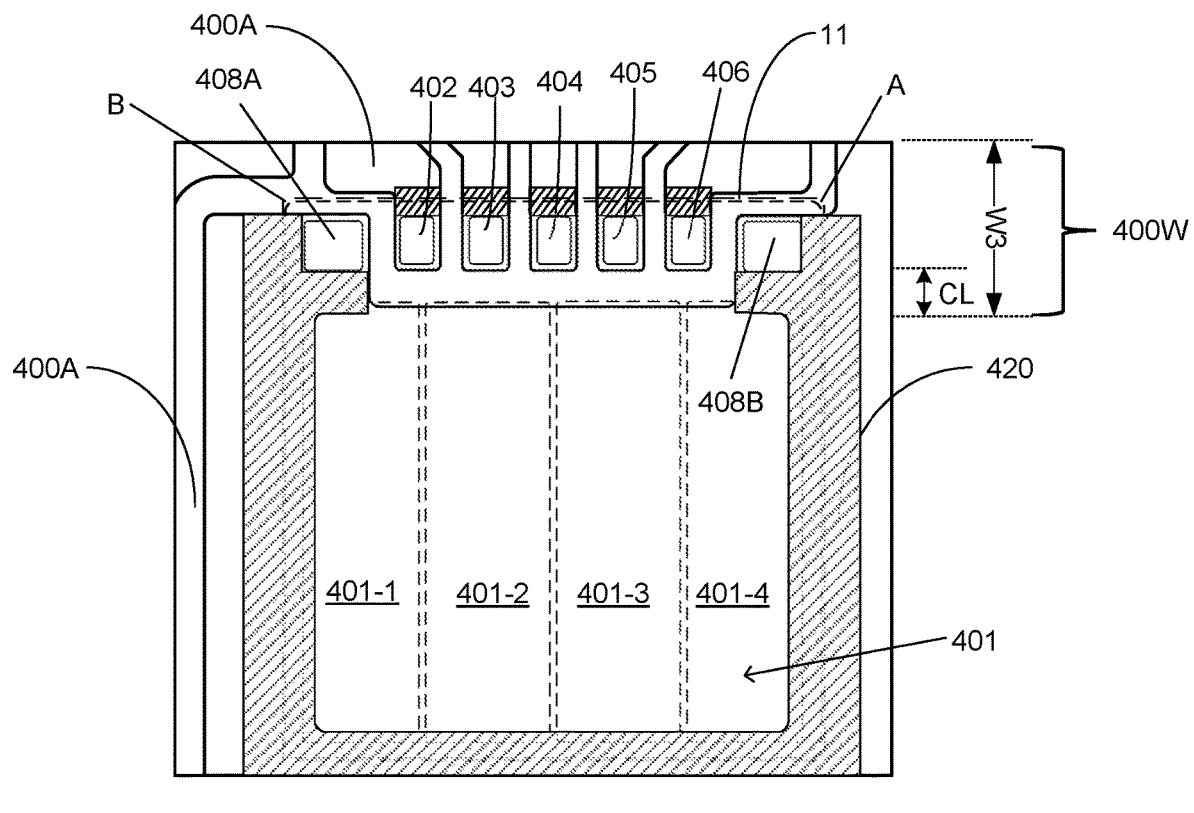
FIGS. 4 through 6 illustrates plan views of a DBC substrate in accordance with the embodiments described herein.

FIG. 4 shows an example DBC substrate 400 for use in a power device package. DBC substrate 400 may have a conductive metal (e.g., copper, aluminum) trace pattern 400A on which a semiconductor die (e.g., semiconductor die 11, FIG. 1) can be bonded, for example, with solder joints, in accordance with the principle of the present disclosure. DBC substrate 400 may have a rectangular or square X-Y shape. Each side of the X-Y shape may be several millimeters long (e.g., X=15.2 mm, Y=15.2 mm).

FIG. 4 shows a plan view of DBC substrate 400 with conductive metal trace pattern 400A. Conductive metal trace pattern 400A may be designed to be overlaid by a solder pads layout matching a layout of device contact pads on the semiconductor die (e.g., layout 100A, semiconductor die 11, FIG. 1). The solder pads layout on conductive metal trace pattern 400A may, for example, include active solder pads (e.g., active solder pads 401) such as emitter contact solder pads 401-1, 401-2, 401-3, and 401-4; signal sense contact solder pads 402, 403, 404, 405, and 406; and inactive solder pads (e.g., dummy device contact solder pads 408A and 408B, etc.) to form the solder joints for bonding the device contact pads of semiconductor die 11 to substrate 400.

Semiconductor die 11 may be placed in a flip-chip arrangement on substrate 400 to form a semiconductor die-substrate combination and bonded, for example, by solder reflow. Emitter contact solder pads 401-1, 401-2, 401-3, and 401-4 may form solder joints to the emitter contact pads (e.g., pads 101-1, 101-2, 101-3, and 101-4) of semiconductor die 11 (FIG. 1); signal sense contact solder pads 402, 403, 404, 405, and 406 may form solder joints to the signal sense contact pads (e.g., signal sense contact pads 102, 103, 104, 105, and 106) of semiconductor die 11 (FIG. 1); and dummy device contact solder pads 408A and 408B may form solder joints to the dummy device contact pads (e.g., dummy device contact pads 108A and pad 108B) of semiconductor die 11 (FIG. 1). The dummy device contact solder pads 408A and 408B may be used to bind corners of DBC substrate 400 to corners (e.g., corners A and B) of the semiconductor die. FIG. 4 also shows a solder block 420 that may be placed around the solder pads on DBC substrate 400 to prevent solder overflow in fabrication processes that use, for example, solder reflow in the solder pads, for bonding semiconductor die 11 to the DBC substrate.

Figure 8:
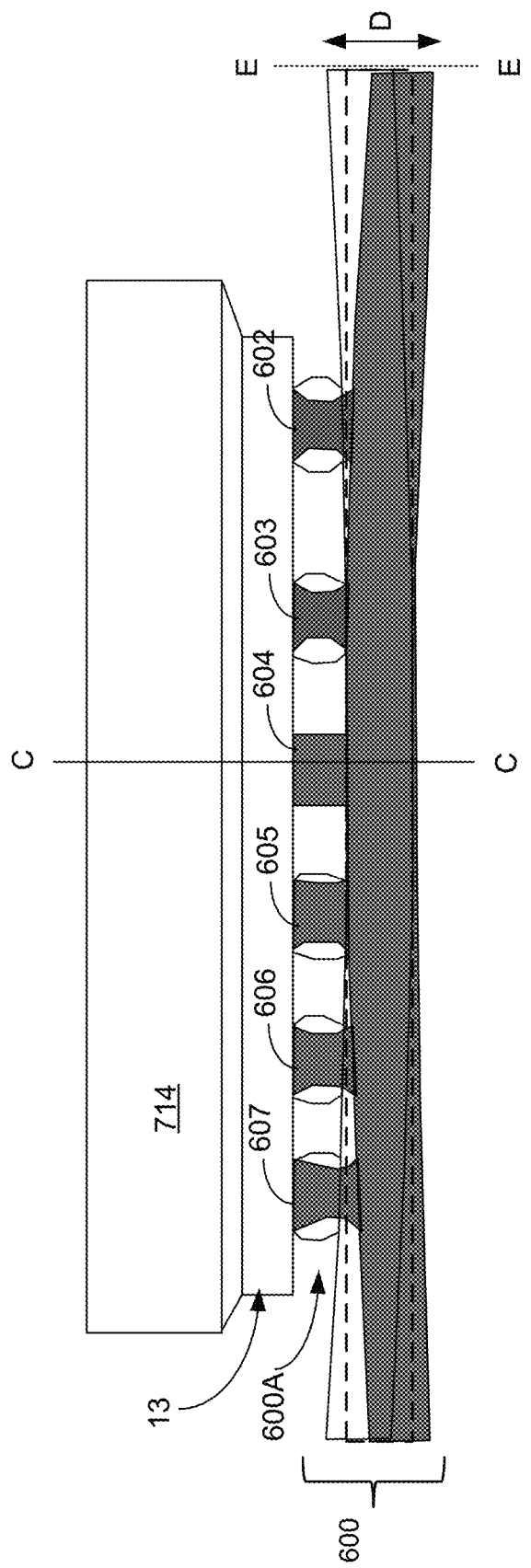
FIG. 8 pictorially illustrates thermally-induced flexing, bending or warpage of a substrate in a package.

In example implementations, the emitter contact solder pads (e.g., pads 401-1, 401-2, 401-3, and 401-4) may have rectangular x-y dimensions of a few millimeters on each side (e.g., x=3.211 mm and y=11.4 mm, or x=3.497 mm and y=11.4 mm) and occupy most of the area of DBC substrate 400. The emitter contact solder pads may mechanically stiffen portions of DBC substrate 400 that are covered by the emitter contact solder pads. The signal sense contact solder pads (e.g., pads 402, 403, 404, 405, and 406) may be placed on a strip 400W of DBC substrate 400 above the emitter contact solder pads. This strip 400W (having a width W3) may be susceptible to thermally induced flexing or bending (e.g., as shown in FIG. 8), which can damage the small sense solder joints placed in strip 400W. In the example shown in FIG. 4, the smaller signal sense contact solder pads (e.g., pads 402, 403, 404, 405, and 406) may be placed in strip 400W at about a cantilever length CL above the larger emitter contact solder pads (e.g., pads 401-1, 401-2, 401-3, and 401-4). In example implementations, the cantilever length CL may be a few millimeters (e.g., 1.2 millimeters, 1.5 millimeters, etc.). A smaller cantilever length CL in the solder pads layout can reduce a potential displacement of, and consequently reduce the stress and damage to, the smaller signal sense contact solder pads in strip 400W than can be caused by a larger cantilever length CL.

Figure 5:
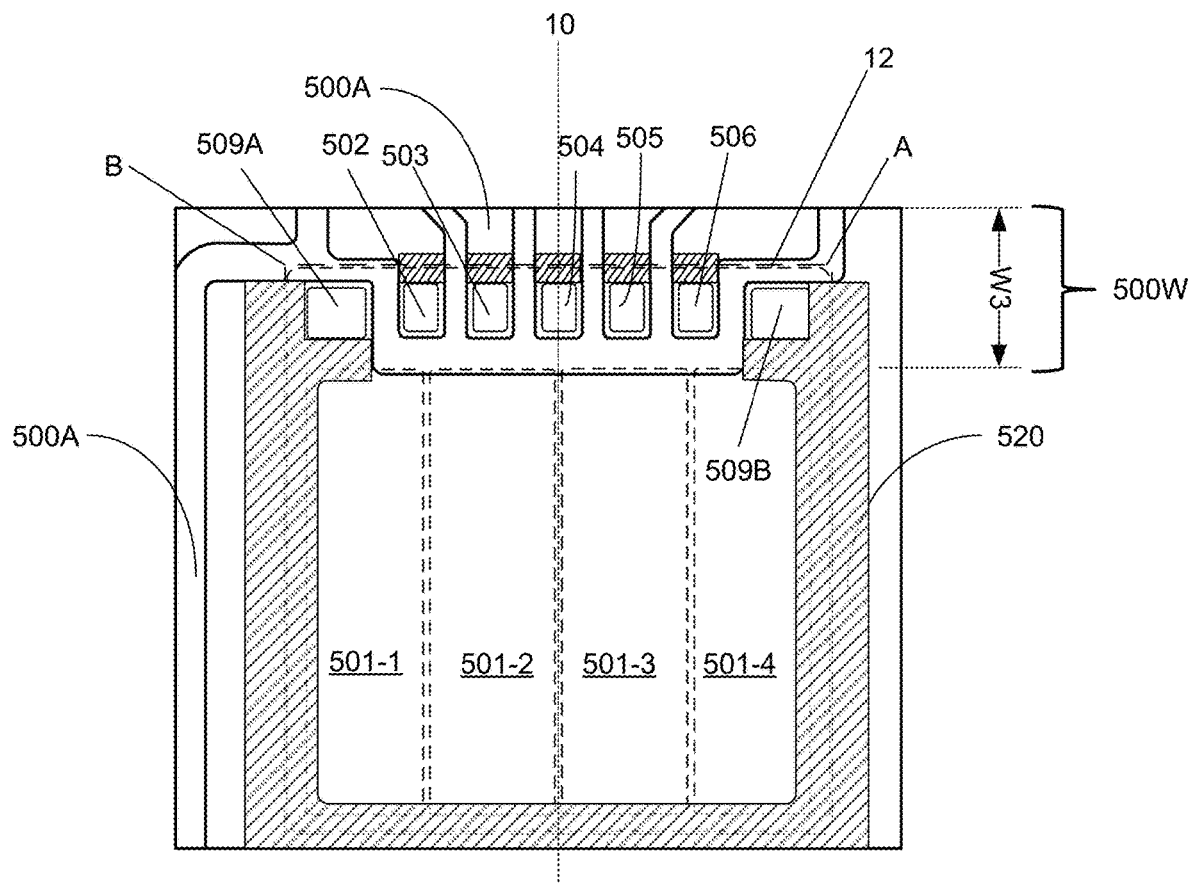

FIG. 5 shows an example of a DBC substrate 500 for use in a power device package. DBC substrate 500 may have a conductive metal (e.g., copper, aluminum) trace pattern 500A on which semiconductor die 12 with a device contact pad layout 100B (FIG. 2) can be bonded, example, with solder joints, in accordance with the principle of the present disclosure. Like DBC substrate 400 (FIG. 4), DBC substrate 500 may have a rectangular or square X-Y shape. Each side of the X-Y shape may be several millimeters long (e.g., X=15.2 mm, Y=15.2 mm).

FIG. 5 shows a plan view of DBC substrate 500 with a conductive metal trace pattern 500A. Conductive metal trace pattern 500A may be designed to be overlaid by a solder pads layout matching a layout of device contact pads on the semiconductor die (e.g., layout 100B, semiconductor die 12, FIG. 2). The solder pads layout on conductive metal trace pattern 500A may, for example, include active solder pads (e.g., active solder pads such as emitter contact solder pads 501-1, 501-2, 501-3, and 501-4; signal sense contact solder pads (e.g., pads 502, 503, 504, 505, and 506); and inactive solder pads (e.g., dummy device contact solder pads 509A and 509B, etc.) to form the solder joints for bonding the device contact pads of semiconductor die 12 to substrate 500. The signal sense contact solder pads and the inactive solder pads may be placed on a strip 500W of DBC substrate 500 above the emitter contact solder pads. Strip 500W may have a width W3.

Semiconductor die 12 may be placed in a flip-chip arrangement on substrate 500 to form a semiconductor die-substrate combination and bonded, for example, by solder reflow. Emitter contact solder pads 501-1, 501-2, 501-3, and 501-4 may form solder joints to the emitter contact pads (e.g., pads 101-1, 101-2, 101-3, and 101-4) of semiconductor die 12 (FIG. 2); signal sense contact solder pads 502, 503, 504, 505, and 506 may form solder joints to the signal sense contact pads (e.g., signal sense contact pads 102, 103, 104, 105, and 106) of semiconductor die 12 (FIG. 1); and dummy device contact solder pads 509A and 509B may form solder joints to the dummy device contact pads (e.g., dummy device contact pads 109A and pad 109B) of semiconductor die 12 (FIG. 1). The dummy device contact solder pads 509A and 509B may be used to bind corners of DBC substrate 500 to corners (e.g., corners A and B) of the semiconductor die. FIG. 5 also shows a solder block 520 that may be placed around the solder pads on DBC substrate 500 to prevent solder overflow in fabrication processes that use, for example, reflow of the solder in the solder pads, for bonding semiconductor die 12 to the DBC substrate.

Figure 6:
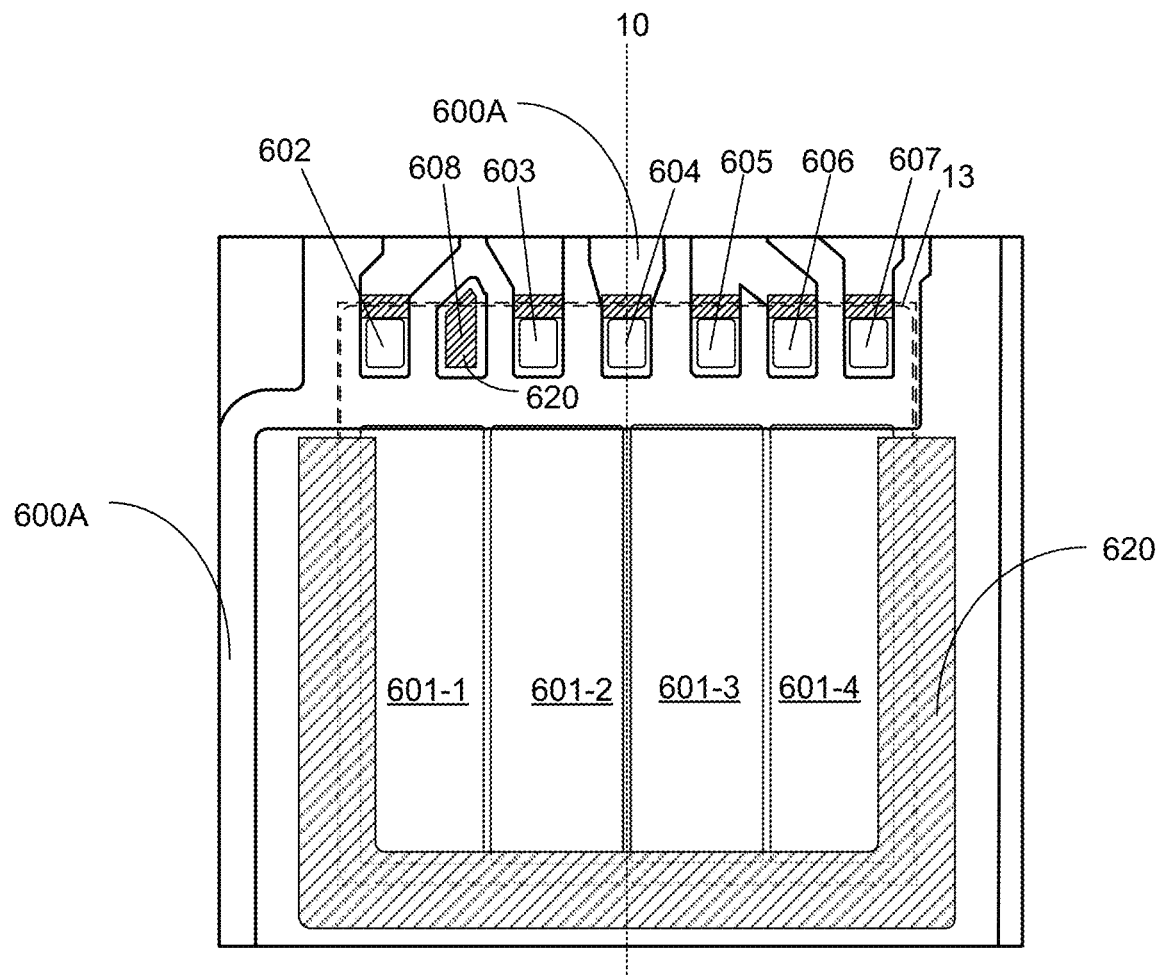

FIG. 6 shows an example of a DBC substrate 600 for use in a power device package. DBC substrate 600 may have a conductive metal (e.g., copper, aluminum) trace pattern 600A on which semiconductor die 13 with a device contact pad layout 100C (FIG. 3) can be bonded, example, with solder joints, in accordance with the principle of the present disclosure. As previously shown in FIG. 3, device contact pad layout 100C may be a traditional device contact layout which does not include dummy device contact pads in addition to traditional signal sense contact pads. The traditional signal sense contact pads are asymmetrically distributed device contact pad layout 100C. Like DBC substrate 400 (FIG. 4) and DBC substrate 500 (FIG. 5), DBC substrate 600 may have a rectangular or square X-Y shape. Each side of the X-Y shape may be several millimeters long (e.g., X=15.2 mm, Y=15.2 mm).

FIG. 6 shows a plan view of a DBC substrate 600 with a conductive metal trace pattern 600A. Conductive metal trace pattern 600A may be designed to be overlaid by a solder pads layout matching a layout of device contact pads on the semiconductor die (e.g., layout 100C, semiconductor die 13, FIG. 3). The solder pads layout on conductive metal trace pattern 500A may, for example, include active solder pads (e.g., active solder pads such as emitter contact solder pads 601-1, 601-2, 601-3, and 601-4; and signal sense contact solder pads 602, 603, 604, 605, 606 and 607 to form the solder joints for bonding the device contact pads of semiconductor die 13 to substrate 600. The solder pads layout on conductive metal trace pattern 500A may include solder pads (e.g., solder pad 608) that do not correspond to a device contact pad on semiconductor die 13.

Semiconductor die 13 may be placed in a flip-chip arrangement on substrate 600 to form a semiconductor die-substrate combination and bonded, for example, by solder reflow. Emitter contact solder pads 601-1, 601-2, 601-3, and 601-4 may form solder joints to emitter contact pads (e.g., pads 101-1, 101-2, 101-3, and 101-4) of semiconductor die 13 (FIG. 3); and signal sense contact solder pads 602, 603, 604, 605, 606, and 607 may form solder joints to the signal sense contact pads (e.g., signal sense contact pads 102C, 103C, 104C, 105C, 106C and 107C (FIG. 3) of semiconductor die 13.

FIG. 6 also shows a solder block 620 that may be placed around the solder pads on DBC substrate 600 to prevent solder overflow in fabrication processes that use, for example, reflow of the solder in the solder pads, for bonding semiconductor die 13 to the DBC substrate. Solder block 620 may also be placed on signal sense contact solder pads (e.g., solder pad 608) that do not correspond to a device contact pad on semiconductor die 13.

Figure 7:
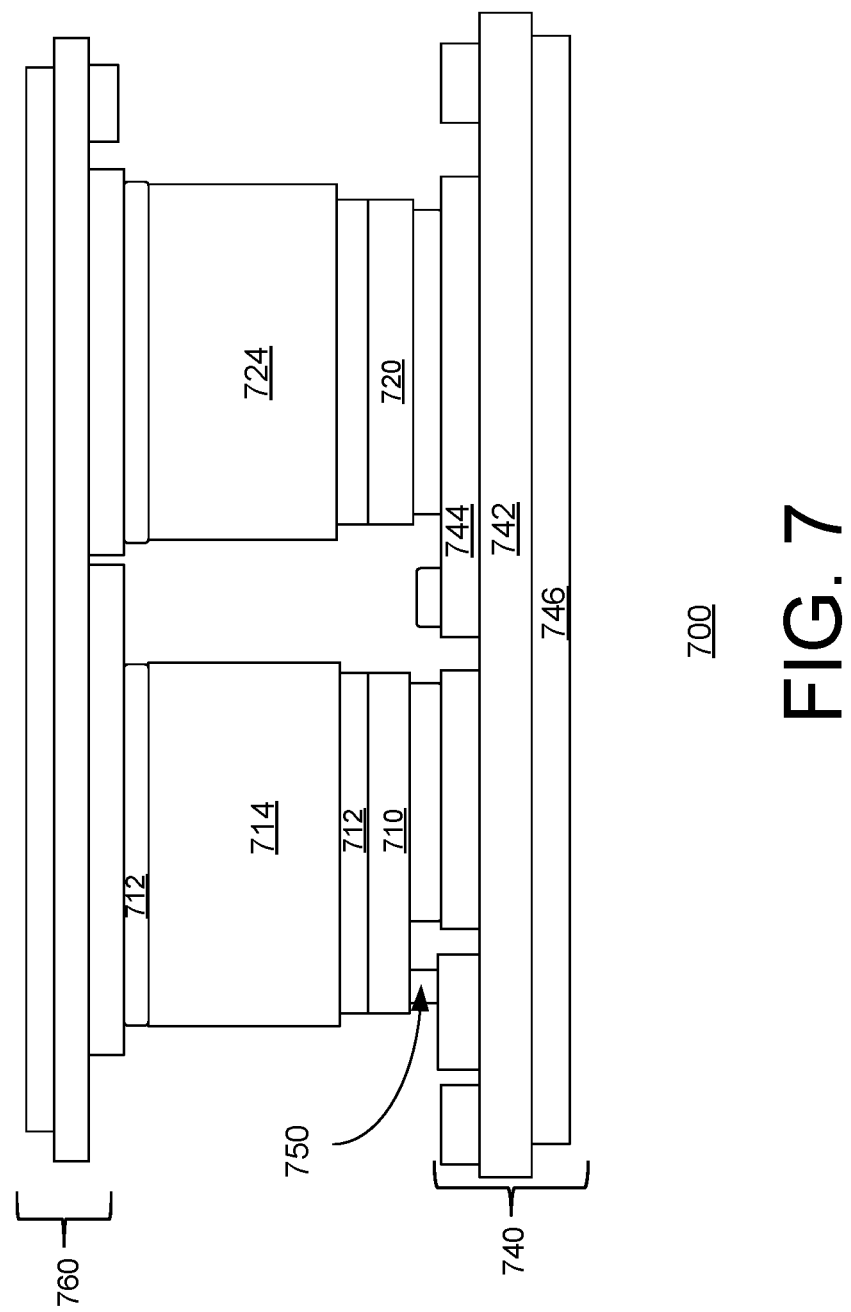
FIG. 7 illustrates a cross-sectional view of a dual-side cooled device package.

FIG. 7 shows a cross-sectional view of a dual-side cooled device package 700. Package 700, which may include an IGBT device and an FRD device, may be used in a dual-side cooled high power device module.

Package 700 may include one or more semiconductor die, for example, a first semiconductor die 710 (e.g., an IGBT) and a second semiconductor die 720 (e.g., an FRD) that are attached to a DBC substrate 740. Conductive spacer blocks 714, 724 (e.g., copper blocks) may be bonded to semiconductor die 710 and semiconductor die 720 using, for example, a solder layer 712.

DBC substrate 740 may, for example, include a dielectric layer (e.g., ceramic layer, polymer layer) 742 that is plated, coated, or printed, on both sides, with copper or other electrically conductive material layers (e.g., conductive layer 744, conductive layer 746). Dielectric layer 742 may be made from electrically insulating, but thermally conductive materials (e.g., Zr-doped alumina). In some implementations, conductive layer 746 may be, or can include, a copper layer. Conductive layer 744 may be, or can include, a patterned copper layer with traces, lines, or paths for distribution of electrical currents and voltages.

A pattern of solder pads 750 may be disposed on conductive layer 744 on substrate 740. The semiconductor die 710 and 720 (with bonded spacer blocks 714 and 724) may be bonded to substrate 740 in a flip-chip configuration using the pattern of solder pads 750 as joining material. In general, the pattern of solder pads 750 may include a number of active solder pads that are geometrically aligned to provide electrical connection between specific I/O contacts (e.g., terminals) on the semiconductor die and conductive layer 744 (e.g., a patterned copper layer) on substrate 740. In the case of an IGBT, the specific I/O contacts may, for example, include: current sense (CS); emitter sense (ES); gate (G); temperature sense cathode (TC); and temperature sense anode (TA), etc.

Solder pads 750 in addition to providing electrical connection between semiconductor die and substrate 740 serve to mechanically bond semiconductor die 710 and substrate 740 together.

In example implementations, first semiconductor die 710 in package 700 may, for example, be semiconductor die 11 (FIG. 1), semiconductor die 12 (FIG. 2), or semiconductor die 13 (FIG. 3). DBC substrate 740 may correspondingly be, for example, DBC substrate 400 (FIG. 4), DBC substrate 500 (FIG. 5), or DBC substrate 600 (FIG. 6).

Fabrication of package 700 as a dual-side cooled package may involve bonding a second DBC substrate (e.g., DBC substrate 760) to the top of conductive spacer blocks 714, 724. Complete fabrication of package 700 as a dual-side cooled package may include mold filling, mold clamping/ epoxy molding compounds (EMCs) packing force, etc. This further processing can have a deleterious impact on the mechanical bonding between semiconductor die 710 and substrate 740 provided by solder pads 750. Differences in the thermal expansion co-efficient (TEC) of the different components (e.g., solder pads, 750, substrate 740, die 710) in package 700 can result in, for example, thermally-induced flexing, bending or warpage (warpage) of the components (e.g., substrate 740) during the further processes in fabrication of package 700.

Consider a case where first semiconductor die 710 in package 700 is, for example, a semiconductor die having a traditional device contact pads layout with no dummy device contact pads (e.g., semiconductor die 13, FIG. 3), and DBC substrate 740 is, for example, DBC substrate 600 (FIG. 6). For this case, FIG. 8 pictorially illustrates, for example, thermally-induced flexing, bending or warpage (bending) of substrate 600 in package 700 as the temperature changes between hot (e.g., concave up) and cold (e.g., concave down). The bending of substrate 600 is likely to cause mechanical stress on, and distort (e.g., compress or expand) solder pads (e.g., pad 602, pad 603, pad 604, pad 605, pad 606 and pad 607) between semiconductor die 13 and substrate 600. The mechanical stress may result in joint failure or damage including cracks, peeling and delamination in the solder and in solder-component interface materials (e.g. Si crack, Si peeling, back nickel (Ni) crack, nickel-aluminum delamination, back side Ni-solder delamination, front Ni crack, solder crack, solder-intermetallic compound (IMC) crack, etc.).

As shown in FIG. 8, a bending displacement D of substrate 600 may be expected to be a function of a distance from, for example, a cantilever support point or axis such as a center C of substrate 600. The displacement D at the center C may be small or zero and may be large at edges E of the substrate. Accordingly, solder pads (e.g., pad 602, pad 607) that are closer to edge E may undergo greater distortion (e.g., compression or expansion) than a solder pad (e.g., pad 603, pad 604, pad 605, etc.) near the center C where the displacement D is small.

In example implementations, the pattern of solder pads 750 (that includes the active solder pads) may include one or more additional dummy solder pads whose primary purpose is to provide additional mechanical strength to the bond between the semiconductor dies (e.g., semiconductor die 710) and substrate 740. Mechanical stiffening of the DBC substrate-to-semiconductor die bond can be achieved by including additional dummy solder pads in the solder pad layout to bind potentially flexible portions of the DBC substrate (e.g., corner or edge portions of the DBC substrate) to the semiconductor die in package 700.

In some implementations (e.g., when first semiconductor die 710 in package 700 is semiconductor die 11 or 12 (FIG. 1, FIG. 2), and DBC substrate 740 is DBC substrate 400 or 500 (FIG. 5, FIG. 6)), a dummy solder pad (e.g., pads 408A and 408B, FIG. 4) may not have any active function (i.e., an electrical connection to any specific I/O function of the semiconductor die). In some implementations, the dummy solder pad may have an active function (e.g., connection to a specific I/O contact). In some implementations, the dummy solder pad may be combined with, or extended to merge with, a solder pad that has an active function (e.g., connection to a specific I/O contact). (e.g., pads 509A and 509B, FIG. 5). The dummy solder pads may be placed near the corners or edges of the substrate that are most likely to undergo the most displacement D. The dummy solder pads may bind otherwise flexible (or free) portions of the substrate (e.g., corner portions that are not mechanically constrained or bound) to the semiconductor die. Active solder pads (i.e., signal sense contact pads that provide electrical connection between the semiconductor die and substrate 740) may be placed away from the edges of the substrate between the dummy solder pads that are placed near the edges of the substrate.

For each of DBC substrate 400 and 500 (shown in FIGS. 4 and 5), the signal sense contact solder pads (e.g., pad 402, pad 403, pad 404, pad 405, and pad 406; and pad 502, pad 503, pad 504, pad 505, and pad 606, respectively) are disposed in a mechanically stabilized portion of strip W3 between the dummy solder pads (e.g., pads 408A and 408B; and pads 509A and 509Bb, respectively) bisymmetrically about a bilateral axis (e.g., bilateral axis 10).

FIG. 9 illustrates an example method 900 for making a device package (e.g., device package 700), in accordance with the principles of the present disclosure.

Method 900 includes disposing a plurality of active solder pads on a substrate, the plurality of active solder pads providing areas for mechanical bonding of the substrate to one or more device contact pads disposed on a semiconductor die (910).

The one or more device contact pads disposed on the semiconductor die may include device contact pads electrically connected to an electronic device formed in the semiconductor die. The device contact pads may include at least an emitter contact pad and one or more signal sense contact pads.

Method 900 further includes disposing one or more mechanical support solder pads on the substrate, the one or more mechanical support solder pads providing areas for mechanical bonding of the substrate to one or more dummy device contact pads disposed on the semiconductor die (920). The one or more dummy device contact pads disposed on the semiconductor die and the one or more mechanical support solder pads on the substrate may provide additional area for solder joints between the semiconductor die and the substrate in addition to areas provided by the plurality of active solder pads and the one or more device contact pads.

Method 900 further includes mechanically bonding the substrate to the semiconductor die by forming solder joints between by forming solder joints between the plurality or active solder pads and the one or more device contact pads, and between the one or more mechanical support pads and the one or more dummy device contact pads (930).

In method 900, mechanically bonding the substrate to the semiconductor die may include mechanically bonding at least one dummy device contact pad on the semiconductor die to an otherwise mechanically flexible corner portion of the substrate using a mechanical support solder pad on the substrate.

The one or more device contact pads disposed on the semiconductor die may include one or more signal sense contact pads disposed in a row alongside an edge of the semiconductor die, and the one or more dummy device contact pads may be disposed on the semiconductor die at about corners of the semiconductor die on both longitudinal ends of the row. Further, the one or more mechanical support solder pads may include mechanical support solder pads disposed on the substrate proximate to corners of the semiconductor die. In method 900, mechanically bonding the substrate to the semiconductor die may include forming solder joints between the mechanical support solder pads and the dummy device contact pads disposed proximate to the corners of the semiconductor die. In example implementations, mechanically bonding the substrate to the semiconductor die may include bonding at least one mechanical support solder pad to a dummy device contact pad that is electrically isolated from an electronic device formed in the semiconductor die. In some example implementations, mechanically binding the substrate to the semiconductor die includes binding at least one mechanical support solder pad to a dummy device contact pad that is electrically connected to an electronic device or circuit formed in the semiconductor die via a device contact pad disposed on the semiconductor die.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A package, comprising:
   a semiconductor die;
   a substrate; and
   a layout of solder pads disposed on a conductive trace on the substrate, the solder pads providing areas for mechanically bonding the substrate to the semiconductor die, the layout of solder pads including:
   a plurality of active solder pads providing electrical connections to an electronic device formed in the semiconductor die; and
   a mechanical support solder pad providing an area in addition to an area provided by the plurality of active solder pads for mechanical bonding of the substrate to the semiconductor die.

2. The package of claim 1, wherein the mechanical support solder pad mechanically bonds a corner portion of the substrate to the semiconductor die.

3. The package of claim 1, wherein the plurality of active solder pads are disposed bisymmetrically about a sagittal axis of the semiconductor die.

4. The package of claim 1, wherein the plurality of active solder pads includes at least one emitter contact solder pad and at least one active signal sense contact solder pad, and wherein the at least one active signal sense contact solder pad is electrically connected to a corresponding one of a plurality of signal sense contact pads disposed in a row on the semiconductor die.

5. The package of claim 4, wherein the mechanical support solder pad is disposed on a longitudinal end of the row of the plurality of signal sense contact pads disposed on the semiconductor die.

6. The package of claim 1, wherein the mechanical support solder pad is electrically isolated from the electronic device formed in the semiconductor die.

7. The package of claim 1, wherein the mechanical support solder pad is electrically connected to the electronic device formed in the semiconductor die via a device contact pad disposed on the semiconductor die.

8. The package of claim 1, wherein the substrate is a direct bonded copper (DBC) substrate.

9. A package, comprising:
   a semiconductor die;
   a substrate;
   an active solder pad disposed on the substrate, the active solder pad being mechanically bonded to a device contact pad disposed on the semiconductor die; and
   a mechanical support solder pad disposed on the substrate, the mechanical support solder pad being mechanically bonded to a dummy device contact pad disposed on the semiconductor die, the dummy device contact pad extending to an emitter contact pad disposed on the semiconductor die.

10. The package of claim 9, wherein the dummy device contact pad is disposed on a corner portion of the substrate and is electrically isolated from an electronic device formed in the semiconductor die.

11. The package of claim 9, wherein the dummy device contact pad is disposed on a corner portion of the substrate and is electrically connected to an electronic device formed in the semiconductor die via the device contact pad disposed on the semiconductor die.

12. The package of claim 9, wherein the device contact pad disposed on the semiconductor die includes at least one signal sense contact pad disposed in a row alongside an edge of the semiconductor die, and the dummy device contact pad is disposed on the semiconductor die at a corner of the semiconductor die on an end of the row.

13. The package of claim 9, wherein the mechanical support solder pad is included in a plurality of mechanical support solder pads disposed on the substrate at a position closer to a corner of the semiconductor die than to a sagittal axis of the semiconductor die.

14. A package, comprising:
   an electronic device formed in a semiconductor die;
   a plurality of device contact pads disposed on a surface of the semiconductor die, the plurality of device contact pads being electrically connected to the electronic device, the plurality of device contact pads including at least an emitter contact pad and a signal sense contact pad; and
   a dummy device contact pad disposed on the surface of the semiconductor die, the dummy device contact pad providing an area for a solder joint between the semiconductor die and a substrate in addition to an area provided by the plurality of device contact pads.

15. The package of claim 14, wherein the dummy device contact pad is disposed on the surface at a position closer to a corner of the semiconductor die than to a sagittal axis of the semiconductor die.

16. The package of claim 14, wherein the plurality of device contact pads are disposed bisymmetrically about a sagittal axis on the surface of the semiconductor die.

17. The package of claim 14, wherein the signal sense contact pad is included in a plurality of signal sense contact pads disposed in a row on the surface along an edge of the semiconductor die.

18. The package of claim 17, wherein the plurality of signal sense contact pads include at least one dummy device contact pad disposed on a longitudinal end of the row of the plurality of signal sense contact pads disposed on the surface along the edge of the semiconductor die.

19. The package of claim 14, wherein the dummy device contact pad is electrically isolated from the electronic device formed in the semiconductor die.

20. The package of claim 14, wherein the dummy device contact pad is electrically connected to the electronic device via one of the plurality of device contact pads.

* * * * *